US012579337B1

(12) United States Patent
Manillier et al.

(10) Patent No.: US 12,579,337 B1
(45) Date of Patent: Mar. 17, 2026

(54) VIRTUAL TESTING OF AUTONOMOUS DRIVING SYSTEMS WITH THERMAL CAMERAS

(71) Applicant: ANSYS, Inc., Canonsburg, PA (US)

(72) Inventors: Ludovic Manillier, La Farlède (FR); Sebastien Abram, La Farlède (FR); Sandra Gely, Los Angeles, CA (US)

(73) Assignee: ANSYS, Inc., Canonsburg, PA (US)

( * ) Notice: Subject to any disclaimer, the term of this patent is extended or adjusted under 35 U.S.C. 154(b) by 1232 days.

(21) Appl. No.: 17/130,039

(22) Filed: Dec. 22, 2020

Related U.S. Application Data

(60) Provisional application No. 62/957,052, filed on Jan. 3, 2020.

(51) Int. Cl.
*G06F 30/20* (2020.01)
*G06T 7/80* (2017.01)

(52) U.S. Cl.
CPC ................ *G06F 30/20* (2020.01); *G06T 7/80* (2017.01); *G06T 2207/10048* (2013.01)

(58) Field of Classification Search
CPC .. G06F 30/20; G06T 7/80; G06T 2207/10048
USPC .............................................................. 703/8
See application file for complete search history.

(56) References Cited

U.S. PATENT DOCUMENTS

| | | | | |
|---|---|---|---|---|
| 10,332,292 | B1 * | 6/2019 | Arnicar | G06F 3/011 |
| 2005/0247337 | A1 * | 11/2005 | Chen | H10N 10/00 136/211 |
| 2018/0268237 | A1 * | 9/2018 | Stanimirovic | G06T 7/248 |
| 2020/0006988 | A1 * | 1/2020 | Leabman | A61B 8/56 |
| 2020/0184710 | A1 * | 6/2020 | Besley | G06T 19/00 |
| 2021/0398281 | A1 * | 12/2021 | Lys | H04N 23/56 |

OTHER PUBLICATIONS

Yu, Guanfeng, and Guofeng Zhang. "Real-time simulation of airborne FLIR sensor." 2016 IEEE Chinese Guidance, Navigation and Control Conference (CGNCC). IEEE, 2016. (Year: 2016).*

FLIR, Lepton with Radiometry Quickstart Guide, Document No. 102-PS245-76 Rev 121, 7 pages, Jun. 14, 2018 (see www.flir.com/globalassets/imported-assets/document/lepton-with-radiometry-quickstart-guide.pdf, downloaded Aug. 12, 2024.

SciPy API, The SciPy community, copyright 2008-2024, Optimization and root finding (scipy.optimize); https://docs.scipy.org/doc/scipy/reference/optimize.minimize-bfgs.html, downloaded Aug. 12, 2024.

* cited by examiner

*Primary Examiner* — John E Johansen
(74) *Attorney, Agent, or Firm* — WOMBLE BOND DICKINSON (US) LLP

(57) ABSTRACT

In one embodiment, use of virtual thermal cameras in simulations systems can rapidly increase the deployment of vehicles with autonomous driving systems that include thermal cameras as a part of the sensor systems that detect people, other cars, etc. This use can be achieved by calibrating virtual thermal cameras using a virtual object or scenes with predetermined temperatures of objects (humans) in the scenes. The virtually calibrated thermal camera can then be used in virtual simulations of driving scenarios to generate learning data, such as virtual thermal images, to test autonomous driving systems and autonomous driving algorithms. The calibration can use a temperature conversion process, and the generation of the learning data can also use this temperature conversion process that includes the addition of noise, represented by temperature values.

20 Claims, 7 Drawing Sheets

| |
|---|
| RECEIVE THERMAL CAMERA INPUTS TO DEFINE CAMERA MODEL ～101 |
| CALIBRATE THERMAL CAMERA MODEL ～103 |
| STORE CALIBRATED THERMAL CAMERA MODEL WITH CALIBRATED CONVERSION BETWEEN ENERGY AND TEMPERATURE ～105 |

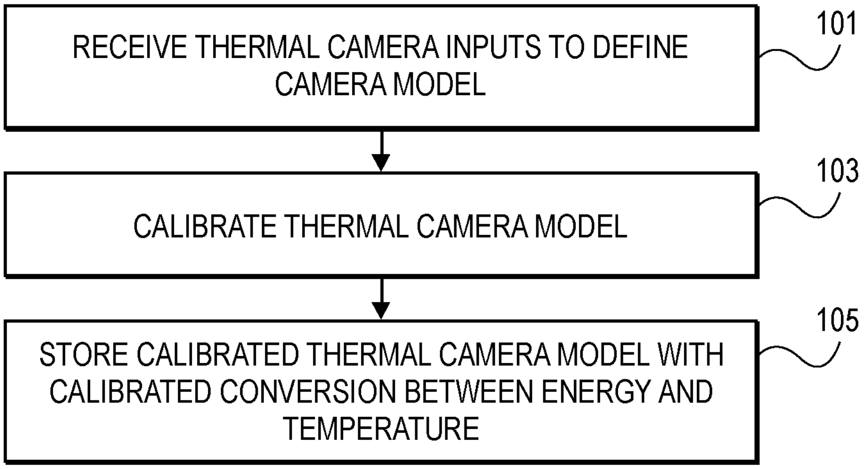

FIG. 3A

CALIBRATION PROCESS

131 ～ KNOWN TEMPERATURES ON VIRTUAL OBJECT(S)
(E.G. $T_{in}$)

133 ～ SCENE PROPAGATION AND LENS PROPAGATION

PROCESS VIRTUAL ENERGY MAP TO CREATE VIRTUAL TEMPERATURE MAP ～135

THERMAL CAMERA $T_{out}$     137

141

ADJUST SENSOR PARAMETERS (E.G. R,B,F,O)

NO ← CONVERGED SOLUTION? ～139

YES $T_{out} = T_{in}$ ～143
(or $| T_{out} - T_{in} | <$ SMALL THRESHOLD VALUE)

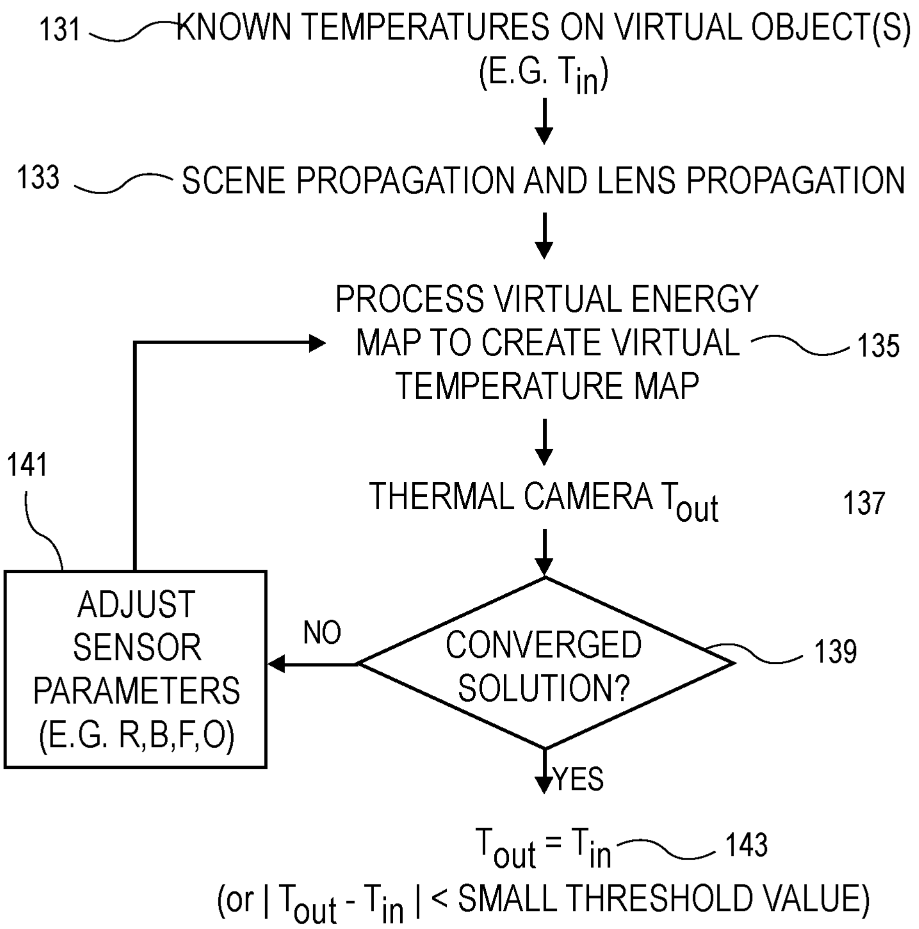

FIG. 3B

COMPUTE LIGHT RAYS EMITTED IN INFRARED (E.G., LWIR) FROM EACH OBJECT IN A VIRTUAL SCENE BASED ON OBJECT'S TEMPERATURE (E.G. A HUMAN AT 37°C) AND MATERIAL PROPERTIES AS DEFINED BY A USER OF THE SIMULATION SYSTEM ⟩ 301

COMPUTE THE PROPAGATION OF THE LIGHT RAYS IN THE SCENE THROUGH THE ATMOSPHERE ⟩ 303

COMPUTE THE PROPAGATION OF THE LIGHT RAYS THROUGH THE LENS MODEL OF THE VIRTUAL THERMAL CAMERA ⟩ 305

CONVERT ENERGY DATA AT PIXELS (FROM THE COMPUTED RAYS) TO TEMPERATURE DATA (USING THE CALIBRATED THERMAL CAMERA MODEL) AND ADD NOISE (IN TEMPERATURE VALUES) TO CREATE TEMPERATURE MAP (WITH A TEMPERATURE VALUE AT EACH PIXEL) ⟩ 307

CONVERT TEMPERATURE MAP TO IMAGE AND STORE IMAGE ⟩ 309

311
NEED MORE IMAGES?

NO

YES

313
PROVIDE SET OF STORED IMAGES AS A VIDEO TO THE AUTONOMOUS DRIVING SYSTEM ALGORITHM UNDER TEST

315
CHANGE POSITION OF THE VIRTUAL CALIBRATED THERMAL CAMERA AND OBJECT IN THE VIRTUAL SCENE ACCORDING TO DRIVING PATH DEFINED BY THE USER

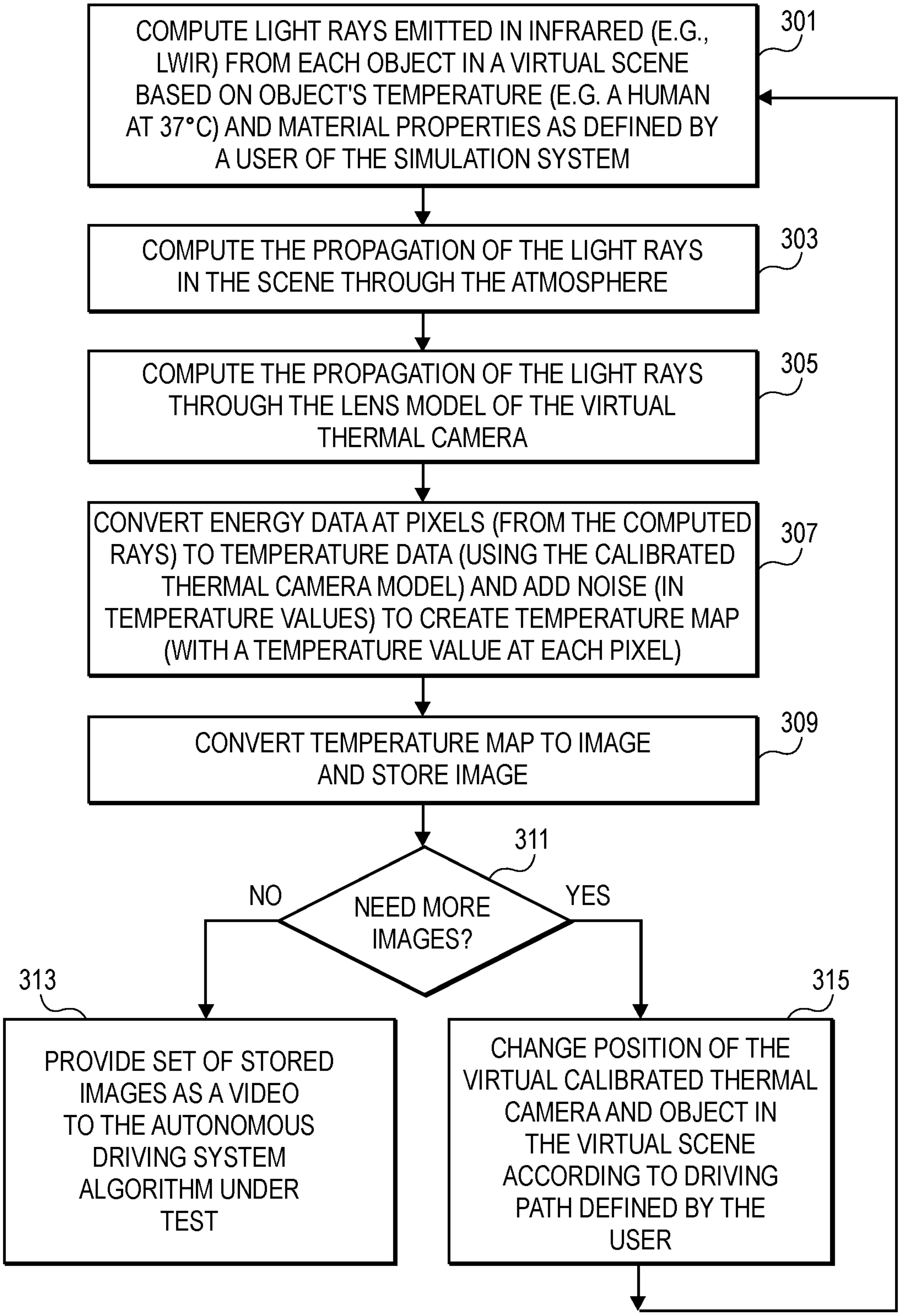

FIG. 5A

VIRTUAL TESTING OF AUTONOMOUS DRIVING SYSTEMS WITH THERMAL CAMERAS

This application claims priority to and the benefit of U.S. provisional patent application No. 62/957,052 filed Jan. 3, 2020, which application is hereby incorporated herein by reference.

BACKGROUND

This disclosure relates to sensor systems and the modeling of such sensor systems, such as sensor systems used in autonomous driving in which a data processing system receives inputs from sensors and generates outputs, based on those inputs, to control the operation of a vehicle, such as a car. Such sensor systems have included cameras that capture images in wavelengths in the visible light band (e.g., 400 to 700 nm) and in the near infrared light band, and also ultrasonic sensors, lidar sensors, and radar sensors. Recently, automobile manufacturers have considered the use of thermal cameras that capture images in the far infrared wavelength (e.g., 7 to 14 microns). Automotive companies currently test autonomous driving algorithms (that use outputs from thermal cameras) on vehicles in real life testing scenarios using real thermal (far infrared) cameras on real vehicles in actual driving scenarios. These tests require that cars be driven for many hours over many different scenarios, including those scenarios which are difficult to reproduce. As a result, the development of new autonomous driving systems that use thermal cameras will be delayed until this type of testing can be completed.

SUMMARY OF THE DESCRIPTION

In one embodiment, use of virtual thermal cameras in simulations systems can rapidly increase the deployment of vehicles with autonomous driving systems that include thermal cameras as a part of the sensor systems that detect people, other cars, etc. This use can be achieved by calibrating virtual thermal cameras using a virtual object or scenes with predetermined temperatures of objects (e.g., humans or objects with predefined temperatures) in the scenes. The virtually calibrated thermal camera can then be used in virtual simulations of driving scenarios to generate learning data, such as synthetic or virtual thermal images, to test autonomous driving systems and autonomous driving algorithms. The images are synthetic or virtual in that they are created in a data processing system rather than being captured by a camera. The calibration, in one embodiment, optimizes a temperature conversion process, and the generation of the learning data (e.g., thermal images created by the virtually calibrated thermal camera) can use this optimized temperature conversion process.

A method according to one embodiment can include the following operations: calibrating a virtual thermal camera using a known virtual object, in a calibration scene, that has a predetermined temperature (or a set of virtual objects with a plurality of predefined temperatures in the calibration scene), and this calibrating can include calculating a set of sensor parameters of the virtual thermal camera to produce calibrated sensor parameters that cause the virtual thermal camera to provide an output of the temperature of one or more pixels in the calibration scene containing the virtual object; and generating a set of simulated virtual thermal images of a virtual scene surrounding the calibrated virtual thermal camera on a simulated vehicle that is driving through the virtual scene, the generating (of the set of simulated virtual thermal images) using the calibrated virtual thermal camera, with the addition of noise in one embodiment, to compute a set of temperature maps of images from the virtual scene, the set of simulated virtual thermal images being derived from the set of temperature maps. In one embodiment, the method can include the further operation of: storing the set of simulated virtual thermal images for use in testing one or more autonomous driving algorithms. In one embodiment in the calibration process, the calculating of the set of sensor parameters comprises repeatedly calculating the set of sensor parameters in an optimization loop until a converged optimum solution for the set of sensor parameters is achieved. In one embodiment, the convergence can be based on a threshold that is compared to a difference between an input temperature from the object in the calibration scene and an output temperature from the virtual thermal camera model. In one embodiment, the set of sensor parameters are camera specific parameters that are used in one or more equations to convert between energy data and temperature data; these camera specific parameters can be specific to a particular brand and product/model of thermal camera (e.g., a Boson LWIR camera from FLIR Systems, Inc.).

In one embodiment, the method can include the further operations of: converting, as part of the calibration, energy data for the one or more pixels in the calibration scene into first pixel temperature data to derive first temperature data for each of the one or more pixels in the calibration scene; and converting, as part of the generating of the set of simulated virtual thermal images, energy data for the one or more pixels in the virtual scene into second pixel temperature data and adding noise data, represented by one or more temperatures, to the second pixel temperature data to derive second combined temperature data for each of the one or more pixels in the virtual scene. In one embodiment, the method can include the further operation of: propagating an energy map from a virtual scene through a virtual atmosphere model and a lens model of the calibrated virtual thermal camera to generate the set of simulated virtual thermal images.

The aspects and embodiments described herein can include non-transitory machine readable media that can store executable computer program instructions that when executed cause one or more data processing systems to perform the methods described herein when the computer program instructions are executed. The instructions can be stored in non-transitory machine readable media such as in dynamic random access memory (DRAM) which is volatile memory or in nonvolatile memory, such as flash memory or other forms of memory. The aspects and embodiments described herein can also be in the form of data processing systems that are built or programmed to perform these methods. For example, a data processing system can be built with hardware logic to perform these methods or can be programmed with a computer program to perform these methods.

The above summary does not include an exhaustive list of all embodiments or aspects in this disclosure. All systems, media, and methods can be practiced from all suitable combinations of the various aspects and embodiments summarized above and also those disclosed in the detailed description below.

BRIEF DESCRIPTION OF THE DRAWINGS

The present invention is illustrated by way of example and not limitation in the figures of the accompanying drawings in which like references indicate similar elements.

FIG. 3A is a flowchart that shows a method according to one or more embodiments for performing a virtual calibration of a virtual thermal camera.

FIG. 3B is a flowchart that illustrates a particular method, according to an embodiment, for performing a virtual calibration of a virtual thermal camera.

FIG. 5A depicts a flowchart that shows a method, according to one or more embodiments, of virtual image generation.

DETAILED DESCRIPTION

Various embodiments and aspects will be described with reference to details discussed below, and the accompanying drawings will illustrate the various embodiments. The following description and drawings are illustrative and are not to be construed as limiting. Numerous specific details are described to provide a thorough understanding of various embodiments. However, in certain instances, well-known or conventional details are not described in order to provide a concise discussion of embodiments.

Reference in the specification to “one embodiment” or “an embodiment” means that a particular feature, structure, or characteristic described in conjunction with the embodiment can be included in at least one embodiment. The appearances of the phrase “in one embodiment” in various places in the specification do not necessarily all refer to the same embodiment. The processes depicted in the figures that follow are performed by processing logic that comprises hardware (e.g. circuitry, dedicated logic, etc.), software, or a combination of both. Although the processes are described below in terms of some sequential operations, it should be appreciated that some of the operations described may be performed in a different order. Moreover, some operations may be performed in parallel rather than sequentially.

Figure 1A:
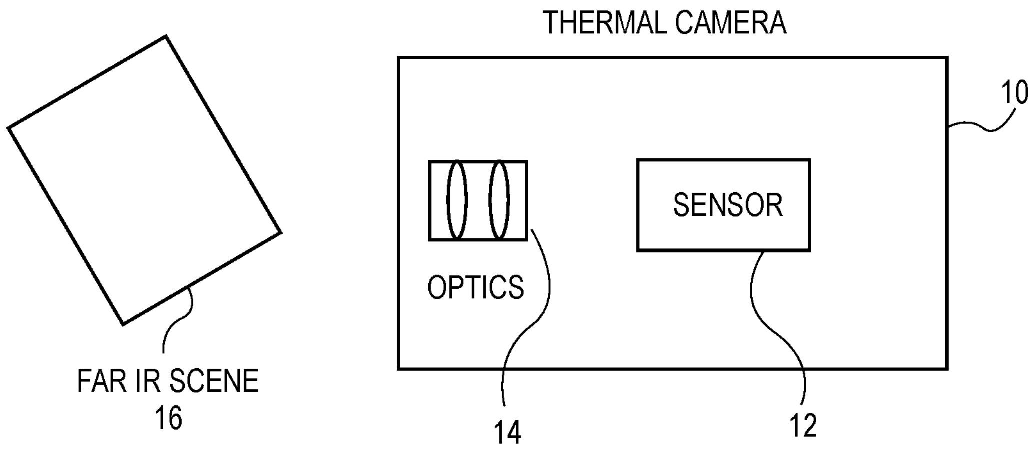
FIG. 1A shows an example of a hardware (real, not virtual) thermal camera.

In the embodiments described herein, a virtual thermal camera can be created based on user inputs and then virtually calibrated, and then the virtually calibrated virtual camera can be used to generate thermal images that can be used to test autonomous systems such as autonomous driving systems. In one embodiment, the virtual thermal camera is represented in data and in software that executes in a data processing system such as a computer. Thus, a physical thermal camera does not exist, but the virtual thermal camera represents a model of the physical thermal camera, and the model can be used in a simulation process that simulates the capturing of virtual thermal images during the simulation, and the virtual thermal camera (which contains a model of a virtual sensor) can, in the simulation, produce outputs of the virtual images that can then be used to test autonomous systems. In one embodiment, the model can specify how an input scene that is presented to the virtual thermal camera will produce an output image based upon the physical characteristics specified in the user data about the particular thermal camera. FIG. 1A shows a simplified view of a physical (real, not virtual) thermal camera. The thermal camera 10 can include a sensor 12 which receives rays from a far infrared scene 16 through optics 14. The far infrared scene 16 can be a real scene in front of the optics 14. The optics 14 can include one or more lenses that focus the image onto the plane of the sensor 12 using techniques known in the art. The thermal camera 10 can be a particular product from a set of thermal cameras from a manufacturer of thermal cameras. Each such product can be modeled in simulation software, and each such product can be modeled in a particular model that is specific for the particular product. In one embodiment, the model will specify how a set of input values will be captured to produce a particular set of output values that are based on the input values; the model can be considered to be similar to a transfer function that specifies how inputs are mapped to outputs.

Figure 1B:
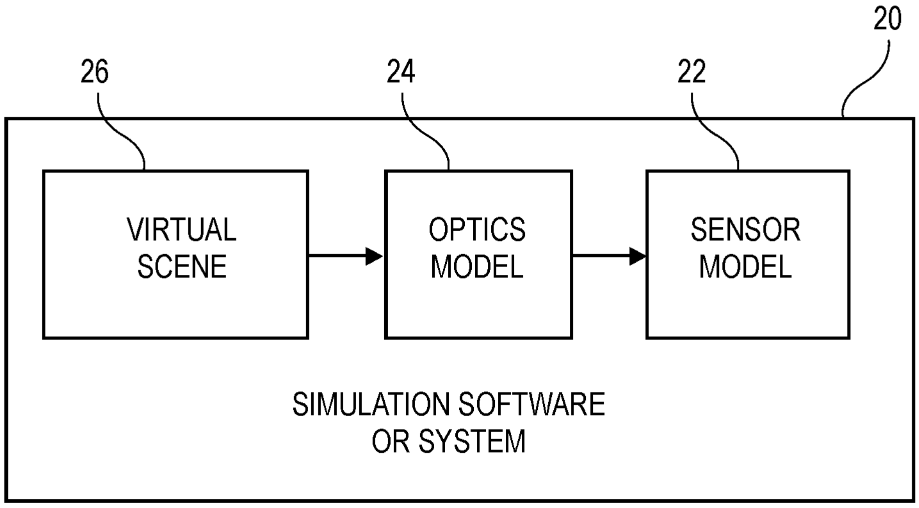
FIG. 1B shows an example of a model of a virtual thermal camera; the model can be implemented in software that represents how the real thermal camera operates.

FIG. 1B shows an example of a software simulation of a camera which can represent a particular thermal camera from a manufacturer of thermal cameras. The simulation 20 can include a camera sensor model 22 which receives energy maps, which can be virtual energy data, from an optics model 24. One or more virtual scenes 26 (containing one or more virtual objects) can be presented to the optics model 24, and the simulation propagates the energy map through the optics model 24 to the sensor model 22 and the sensor model records the energy map based upon its model of how the camera operates, which can include the sensitivity of the camera, the temperature characteristics of the camera, etc. Models for optical systems, such as lens models are known in the art and can be used with the one or more embodiments described herein. Sensor models are also known in the art. In one embodiment, a model for a thermal camera can be built or generated by receiving end user inputs that specify characteristics and parameters about the thermal camera. Examples are provided below of such end-user inputs. These end-user inputs can often be gathered from datasheet information provided by the manufacturer of the thermal camera. These characteristics and parameters can include the information needed to model the lens system and the imager of specific thermal camera. In one embodiment, the thermal camera can be a long wave infrared (LWIR) camera or other applicable infrared camera. In certain embodiments, the input data, such as data from a datasheet about a specific camera, may be received and formatted by a camera builder tool. A virtual calibration of the virtual thermal camera that is to be modeled may be performed based upon input data to create a calibrated thermal camera model corresponding to the specific camera.

Figure 2:
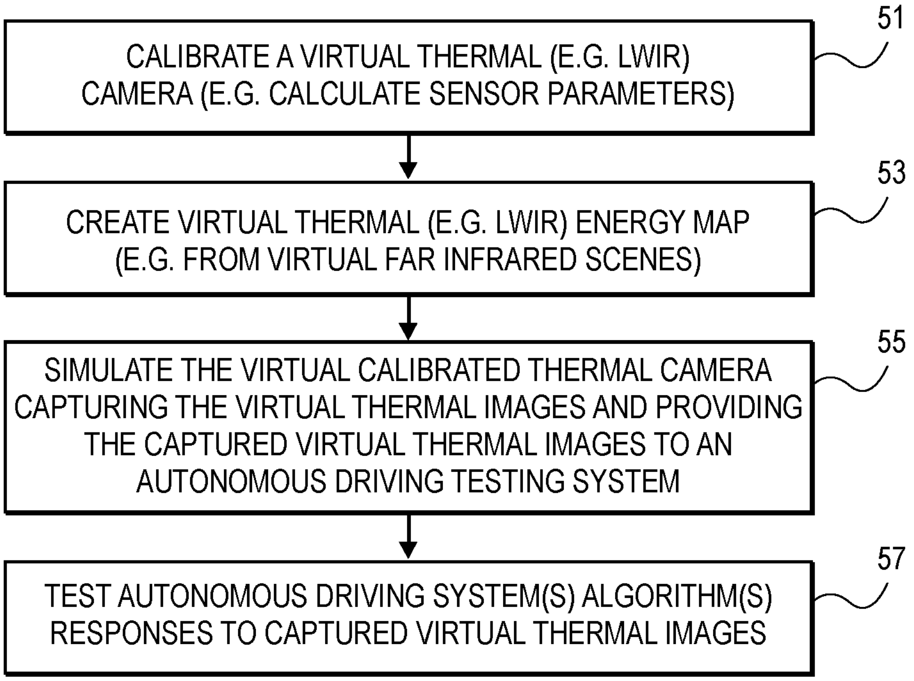
FIG. 2 is a flowchart that shows a method according to one or more embodiments described herein.

FIG. 2 shows an example of an overall flow which can be used with one or more embodiments described herein. In operation 51, a model of a thermal camera can be calibrated to create calibrated sensor parameters. Further details are provided below in connection with this calibration process which can be used to calibrate a virtual thermal camera such as a longwave infrared camera (LWIR). In operation 53, a software simulation system can create one or more energy maps from one or more virtual scenes. In one embodiment, this creation can use ray tracing or rasterization operations that are known in the art to create a raster image that represents the scene in a particular far infrared band such as the longwave infrared band between 7 to 14 μm. Further details are provided below in connection with the process of the creation of these energy maps from these virtual scenes. In one embodiment, the user of the simulation system can specify how these images are to be created, including how many objects are in a particular scene and the movement of the objects in the scene as a car drives through the scene, etc. In one embodiment, the energy map is based on a scene defined in the simulation software by an end user, and the definition of the scene can include the shape of each object in the scene, the material properties of each object in the scene, the temperature of each object in the scene, and the position, orientation, and movement of each object in the scene. In operation 55, the simulation system can simulate the virtual calibrated thermal camera capturing the virtual thermal images and then providing those captured virtual thermal images to an autonomous driving testing system. Then in operation 57, the autonomous driving system can be tested. This often involves testing the autonomous driving system algorithms by presenting the virtual thermal images as inputs to the algorithms (such as a perception algorithm that can analyze the virtual thermal images and detect/recognize objects in the virtual thermal images) to see how they respond to the captured virtual thermal images; for example, the detection of objects by the perception algorithm can be compared to the ground truth information from the input scene to see how accurate the object detection was by the perception algorithm. The response of such system algorithms can further include controlling the car through a control algorithm, such as stopping the car or turning the car or taking other actions with respect to the car. An example of operation 51 in FIG. 2 will now be provided while referring to FIGS. 3A and 3B.

FIG. 3A shows an example of a calibration method which can use the calibration process shown in FIG. 3B. In operation 101 of FIG. 3A, a data processing system, such as a simulation system, can receive thermal camera inputs which can be used to define or create a thermal camera model. Examples of these thermal camera inputs are provided below in conjunction with FIG. 5B. Then in operation 103, the thermal camera model is calibrated by a calibration process, such as the calibration process shown in FIG. 3B. Once calibration is completed, in operation 105 the calibrated thermal camera model can be stored with information which specifies the calibrated conversion between energy and temperature in one embodiment.

Referring now to FIG. 3B, a calibration process shown in FIG. 3B can begin in operation 131 by selecting or creating a virtual energy map of a virtual object that has known temperatures, such as the temperature of a healthy human (37 degrees Celsius). It may be desirable to include multiple different known temperatures in/on multiple virtual objects each with its own known temperature. This would allow the optimization loop (in operations 135, 137, 139 and 141) to train the temperature conversion over multiple known temperature points on the different virtual objects (e.g., at least 4 or more different virtual objects with at least 4 or more different temperatures in one or more virtual scenes). These different multiple temperatures in one embodiment can span a range of temperatures from from −40 degrees C. to 160 degrees C. This input in operation 131 can be considered an initialization step which creates a target temperature value ($T_{in}$) or a set of such values that is used in an optimization loop, described below, to converge to a solution for sensor parameters (e.g., R, B, F, and O) that are adjusted in the optimization loop. In operation 133, the virtual energy map of the one or more virtual objects selected or created in operation 131 is propagated through the virtual atmosphere and through the lens system of the virtual camera (e. g, through a lens model of the lens system) in one embodiment to create an output energy map (e.g., a 2D pixel map in energy values such as Watts/meters$^2$) that is the output from operation 133. The energy data (e.g., expressed in, for example, Watts/meters$^2$) in the energy map provided as the output from operation 133 will then be processed by the virtual thermal camera sensor in operation 135 to produce a temperature map (with a temperature value, expressed in for example degrees Kelvin, for each pixel in the scene) in operation 137, where the temperature data at each pixel of the sensor can be referred to as $T_{out}$. Operation 135 can be viewed as a virtual operation of the sensor in which energy values are received and processed by the sensor and the sensor provides temperature values as outputs for each of the energy value outputs. This output in operation 137 can then be used to optimize sensor parameters, such as sensor parameters R, B, F and O used in this example. In particular, a conversion can be used to optimize these sensor parameters and this conversion can be performed using, for example, one or more equations that relate such energy data to temperatures for a particular thermal camera and can be performed within the virtual thermal camera (e.g., in the simulation software) in one embodiment.

One such equation is described in the Lepton With Radiometry Quickstart Guide from FLIR Systems, Inc. (see www.flir.com/globalassets/imported-assets/document/lepton-with-radiometry-quickstart-guide.pdf); this equation relates energy data, in a pixel, to temperature at the pixel, and thus this equation can be used to convert between energy data (in, for example, W/m$^2$) at a pixel in the image and temperature (in, for example, degrees Kelvin) at the pixel. This equation is:

$$W(T) = \frac{R}{\exp(B/T_K) - F} + 0$$

In this equation, W(T) is the energy data for a pixel, $T_k$ is the temperature, and R, B, F, and O are camera specific constants that can be obtained from a particular camera; in operation 135, the initial values for R, B, F and O can be those constants obtained from a physical instance of such particular camera. These values for R, B, F, and O will change in the optimization loop based upon the difference between $T_{in}$ and $T_{out}$ (while W(T) remains fixed).

The virtual thermal camera in the simulation will produce initial output data in operation 137, based upon the model of the thermal camera, that represents the input scene. This output data can be expressed as temperature data per pixel and compared to the known temperature for each object (e.g., $T_{in}$ in for each object) in operation 139. In particular, operation 139 can determine whether the temperature in the pixels output by the virtual thermal camera from operation 137 is equal to (or within a threshold value of) the known temperature from operation 131 ($T_{in}$). If operation 139 determines that the temperature in the pixels output by the virtual thermal camera from operation 137 ($T_{out}$) is equal to (or within a threshold value of) the known temperature from operation 131 ($T_{in}$), then the simulation system determines that the calibration process has been successfully completed because a converged solution has been obtained. If multiple known temperatures are used in one embodiment, the process can be repeated serially for each known temperature causing the adjustment of the sensor parameters in operation 141 in the optimization loop for each of the known temperatures. If a converged solution has not been obtained as determined by operation 139, the simulation system proceeds to operation 141 in which one or more of the sensor parameters (e.g., R, B, F, & O) in the temperature conversion equation are adjusted/changed and then used again in operations 135 and 137 by the virtual thermal camera to compute temperature values from the energy data in the image provided by operation 135. These new temperature values (new $T_{out}$ values) are then compared in operation 139. Processing in the simulation system will continue repeatedly through the optimization loop until the solution converges as determined by operation 139. The optimization loop can use known fitting methods or optimization methods to achieve a fitting or an optimization in the optimization loop. In one embodiment, a "BFGS" method (e.g., see https://docs.scipy.org/doc/scipy/reference/optimize.minimize-bfgs.html) can be used in the optimization loop (e.g., operation 41) to determine optimum values for the sensor parameters such as R, B, F, & O in this example.

FIG. 5A shows a more specific example of an embodiment that can be used to calibrate a virtual thermal camera and also can be used by the calibrated virtual thermal camera to generate virtual thermal images that can be used to test autonomous driving system algorithms. In operation 301, the simulation system can compute light rays emitted in the infrared band, such as the long wave infrared band, from each object in a virtual scene based on the object's temperature and material properties as defined by a user of the simulation system. The simulation system can use techniques known in the art to compute such light rays. Then in operation 303, the simulation system can compute the propagation of the light rays in the scene through the atmosphere of the scene. Properties of the atmosphere in one embodiment can be specified by the user (for example fog, rain, polluted air or clear air, etc.). Then in operation 305, the simulation system can compute the propagation of the light rays through a lens model of the virtual thermal camera. The output from operation 305 represents an energy map which is projected onto the sensor in the virtual thermal camera, and the model of the virtual thermal camera will produce output values from the sensor in the virtual thermal camera that represent the camera's output response based on the incident energy map from operation 305. These output values are the energy values that are converted in operation 307. In other words, these energy values or energy data at the pixels are converted to temperature data using the calibrated thermal conversion which has been previously calibrated by a calibration process, such as the process shown in FIG. 3B. After the conversion to temperature data, noise can be added to create a temperature map which has a temperature value at each pixel. Then in operation 309, the temperature map can be converted to an image and then the image can be stored. Operation 307 will be described further below in conjunction with FIG. 4. Following operation 309, the system can determine, in operation 311, whether more images are needed to perform the testing of an autonomous driving system algorithm. In one embodiment, many images will typically be required in order to create a stream or video of thermal images which can be supplied to an autonomous driving system algorithm to test the response of the algorithm and to adjust the algorithm based upon the responses of the algorithm under test. If more images are needed processing can proceed to operation 315. In operation 315, the simulation system can change the position of the virtual calibrated thermal camera and one or more objects in the virtual scene according to a driving path that can change and can be defined by the user. Then processing can revert back to operation 301 in which another image is processed as shown in FIG. 5A to ultimately create many images for use in testing an autonomous system. In operation 313, the simulation system can provide the set of stored images as a stream or video to one or more autonomous driving system algorithms to be tested.

Figure 4:
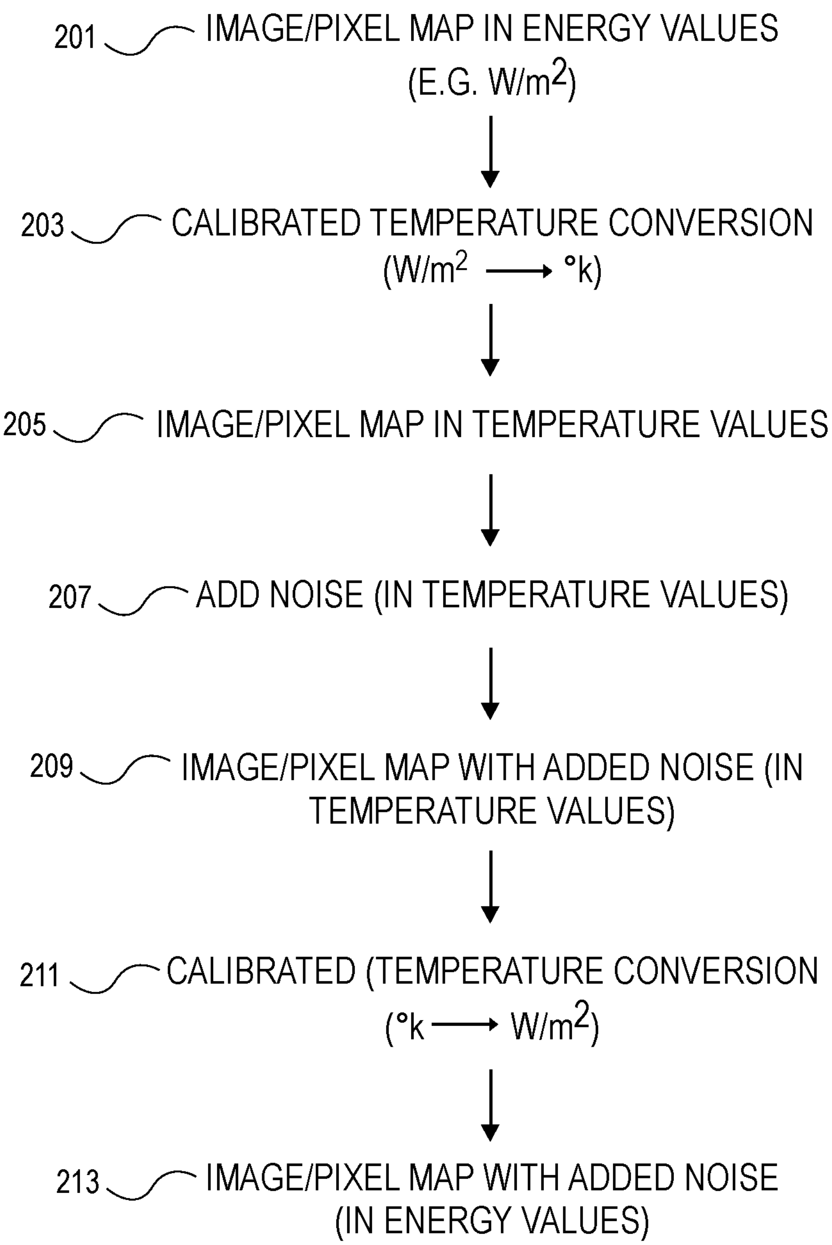
FIG. 4 is a flowchart that shows the addition of noise using a temperature conversion process that can be part of a virtual image generation according to one or more embodiments described herein.

A specific example of operation 307 will now be provided while referring to FIG. 4. In operation 201, the simulation system can receive an energy map with pixel values expressed in energy values, such as watts per meter squared ($W/m^2$). These energy values can be converted in operation 203 by a calibrated temperature conversion equation that was obtained through the calibration process shown in FIG. 3B in which the sensor parameters R, B, F, and O are optimized to provide a calibrated temperature conversion equation. The result of the calibrated temperature conversion from operation 203 provides an image or pixel map in temperature values, shown as operation 205. Then in operation 207, noise expressed in temperature values can be added to the pixel map that is expressed in temperature values. The addition of the noise in one embodiment can involve the addition of known or predetermined values for the noise; these noise values can be obtained from the manufacturer of the thermal camera that has been simulated with a thermal camera model using one of the embodiments described herein. The addition of the noise in operation 207 produces, as shown in operation 209, a pixel map with added noise, where each pixel is represented by a temperature value. Then in operation 211, each pixel value is converted from a temperature value to an energy value to produce an energy map with added noise. In one embodiment, the methods shown in FIGS. 4 and 5A can include amplification of the image data (in energy values) and then digitization by an analog to digital (A/D) conversion. For example, in one embodiment, this amplification and A/D conversion can occur in operation 213 in the case of FIG. 4. Following the A/D conversion, the thermal image can be converted to a temperature map that has temperature values at each pixel in the thermal image, and this thermal image (with temperature values) can be used to test one or more perception algorithms in an autonomous driving system or other automated systems that use machine recognition algorithms.

Figure 5B:
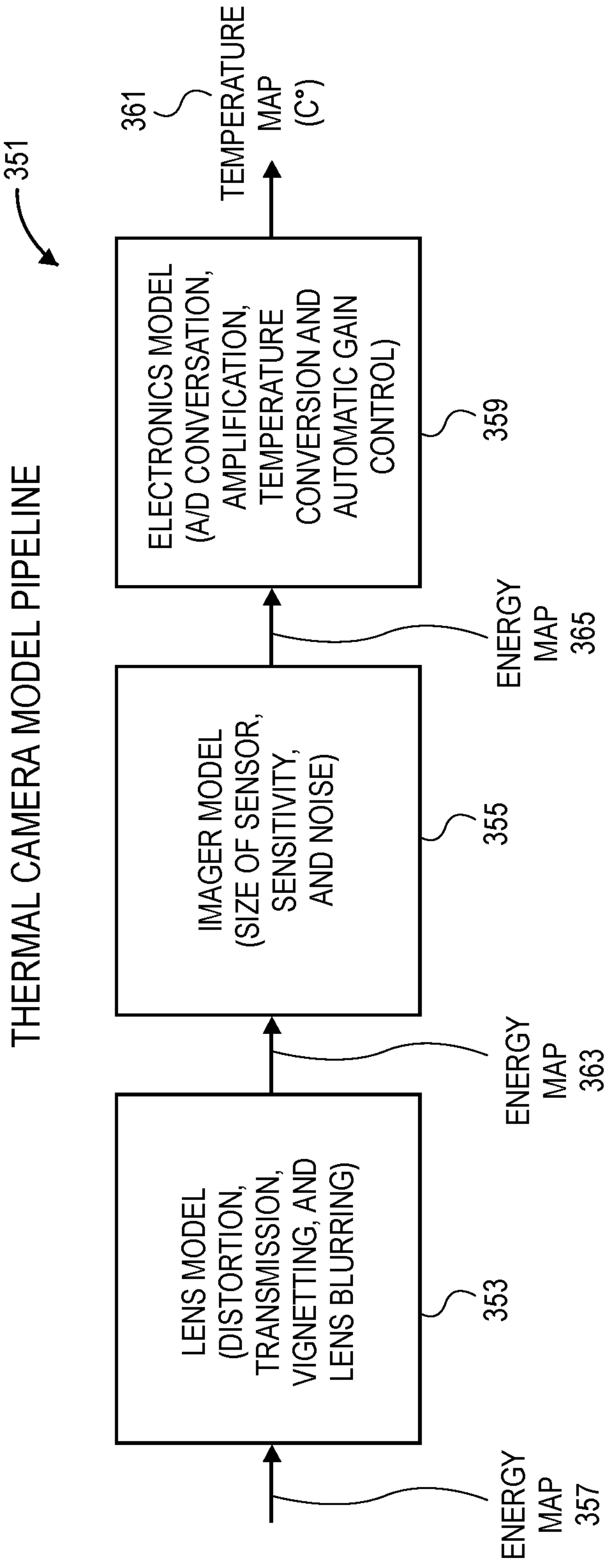
FIG. 5B shows an example, according to one or more embodiments, of the data and the processing that can be used to calibrate a virtual thermal camera (in a virtual calibration process) and to generate virtual images using the calibrated virtual thermal camera.

FIG. 5B shows an example of an embodiment of the simulation system which can be used to both calibrate a virtual thermal camera and then to use the calibrated virtual thermal camera to generate virtual thermal images as described above. The simulation system 351 can be a data processing system that is executing simulation software that creates a lens model 353, an imager model 355, and an electronics model 359 that are operably connected in the pipeline shown in FIG. 5B. The simulation system 351 can use the method shown in FIG. 5A (or the method shown in FIG. 2) to both calibrate the thermal camera model (to derive the calibrated temperature conversion equation based on the calibrated sensor parameters) and to use the calibrated thermal camera model to generate virtual thermal images (synthetic images). The simulation system 351 receives input energy data (a virtual energy map) 357 from a scene; this input energy data can be a set of virtual objects with known temperatures (in the calibration phase in FIG. 3B) in the scene or a generated virtual energy map of a scene (provided as the output from operation 303 in FIG. 5A).

The lens model 353 simulates a physical lens system that is mounted in a camera, and the lens model 353 receives a spectral radiance input that is an energy map 357 of a virtual scene. The lens model 353 can be based on various parameters (that can be provided by a user of the simulation system 351) including, for example: focal length of the lens system, F number of the lens system, Brown distortion coefficients, transmittance of the lens system, relative illumination (for lens vignetting), and point spread function (for lens blurring). The imager model 355 simulates a sensor in the thermal camera, and the imager model 355 receives an energy map 363 that is an output from the lens model 353. The output from the lens model 353 is an energy map having a two dimensional array of pixels, each of the pixels storing energy data that indicates the amount of energy received at the pixel in a far infrared band such as the 7 to 14 micron long wave infrared band. The imager model 355 can be based on various parameters (that can be provided by a user of the simulation system 351) including, for example: sensor size and resolution, sensor sensitivity, integration time, total random noise (at a given temperature), column and row noise and temperature of the sensor. The image model 355 processes the input energy map by simulating the process of the sensor capturing the input energy map and creating an output representation that is the output energy map 365. The output energy map 365 is then provided as an input to the electronics model 359 that simulates the electronics that processes the energy map 365 to create a temperature map 361. The electronics model simulates the analog-to-digital conversion and the amplification and the automatic gain control processes and performs the temperature conversion to provide the temperature map 361. The electronics model 359 can be based on sensor parameters (such as the R, B, F, and O constants) for temperature conversion and/or parameters for the automatic gain control algorithm. Together, the imager model 355 and the electronics model 359 can perform the operations of the methods described herein such as the methods shown in, for example, FIG. 5A or 2.

The inputs from the user of the simulation system can define the lens model 353 (e.g., by defining the focal length, F number, etc) and specify data about the particular sensor being modeled (e.g., size, resolution, etc.) to specify the imager model 355, and this data can come from datasheets provided by the manufacturer of the particular thermal camera being modelled.

Figure 6:
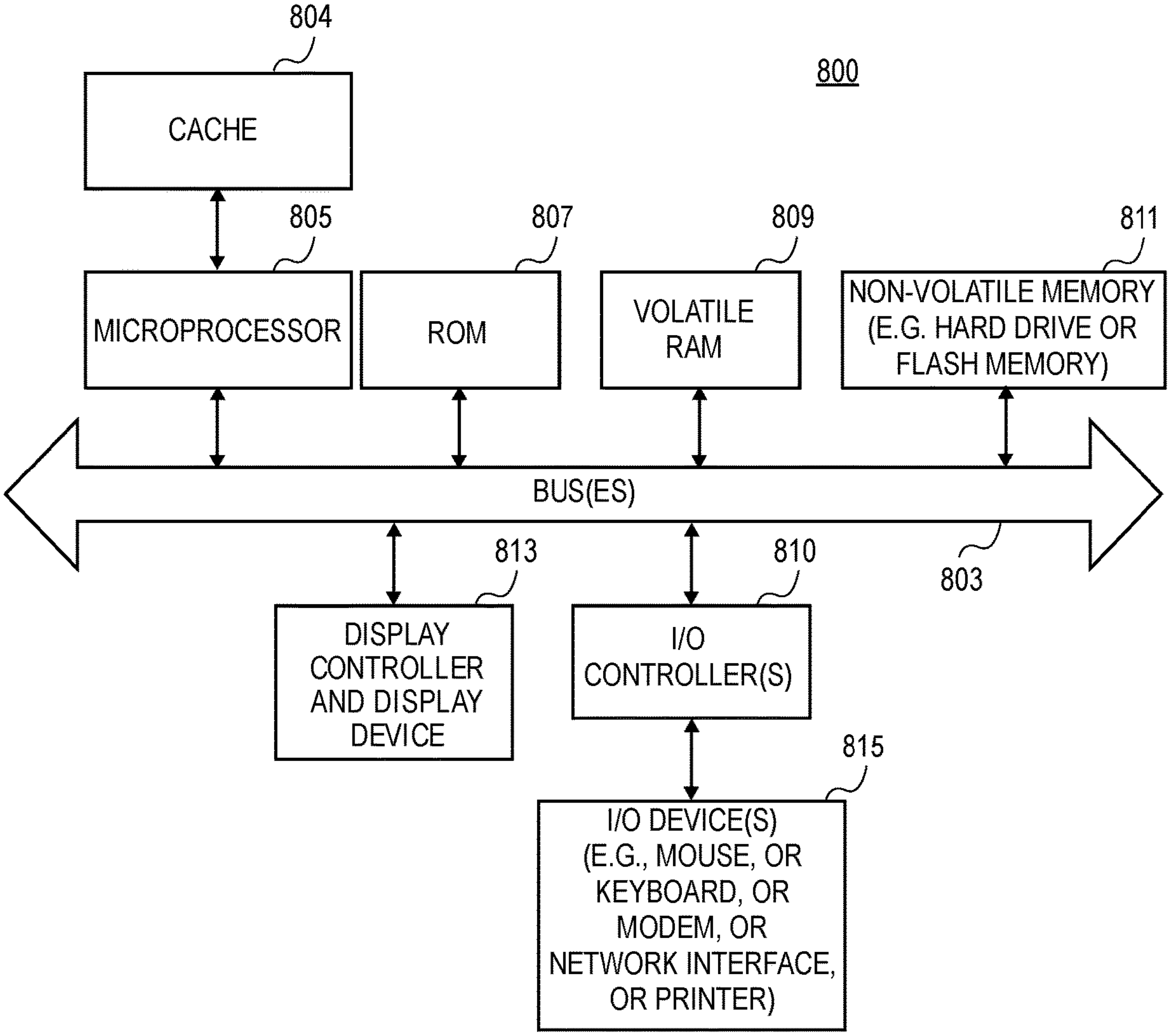
FIG. 6 is a block diagram that shows an example of a data processing system that can be used to calibrate a virtual thermal camera (in a virtual calibration process) and to generate virtual images using the calibrated virtual thermal camera.

FIG. 6 shows one example of a data processing system 800, which may be used with one or more embodiments described herein. For example, the system 800 may be used to perform one or more of the methods described herein such as the methods shown in FIG. 2, 3A, 3B, 4 or 5A. Moreover, the system 800 can be used to implement the simulation system 351 shown in FIG. 5B. Note that while FIG. 6 illustrates various components of a device, it is not intended to represent any particular architecture or manner of interconnecting the components as such details are not germane to the disclosure. It will also be appreciated that network computers and other data processing systems or other consumer electronic devices, which have fewer components or perhaps more components, may also be used with embodiments of the disclosure.

As shown in FIG. 6, the device 800, which is a form of a data processing system, includes a bus 803 which is coupled to a microprocessor(s) 805 and a ROM (Read Only Memory) 807 and volatile RAM 809 and a non-volatile memory 811. The microprocessor(s) 805 may retrieve the instructions from the memories 807, 809, 811 and execute the instructions to perform operations described above. The microprocessor(s) 805 may contain one or more processing cores. The bus 803 interconnects these various components together and also interconnects these components 805, 807, 809, and 811 to a display controller and display device 813 and to peripheral devices such as input/output (I/O) devices 815 which may be touchscreens, mice, keyboards, modems, network interfaces, printers and other devices which are well known in the art. Typically, the input/output devices 815 are coupled to the system through input/output controllers 810. The volatile RAM (Random Access Memory) 809 is typically implemented as dynamic RAM (DRAM), which requires power continually in order to refresh or maintain the data in the memory.

The non-volatile memory 811 is typically a magnetic hard drive or a magnetic optical drive or an optical drive or a DVD RAM or a flash memory or other types of memory systems, which maintain data (e.g., large amounts of data) even after power is removed from the system. Typically, the non-volatile memory 811 will also be a random access memory although this is not required. While FIG. 6 shows that the non-volatile memory 811 is a local device coupled directly to the rest of the components in the data processing system, it will be appreciated that embodiments of the disclosure may utilize a non-volatile memory which is remote from the system, such as a network storage device which is coupled to the data processing system through a network interface such as a modem, an Ethernet interface or a wireless network. The bus 803 may include one or more buses connected to each other through various bridges, controllers and/or adapters as is well known in the art.

Portions of what was described above may be implemented with logic circuitry such as a dedicated logic circuit or with a microcontroller or other form of processing core that executes program code instructions. Thus processes taught by the discussion above may be performed with program code such as machine-executable instructions that cause a machine that executes these instructions to perform certain functions. In this context, a "machine" may be a machine that converts intermediate form (or "abstract") instructions into processor specific instructions (e.g., an abstract execution environment such as a "virtual machine" (e.g., a Java Virtual Machine), an interpreter, a Common Language Runtime, a high-level language virtual machine, etc.), and/or electronic circuitry disposed on a semiconductor chip (e.g., "logic circuitry" implemented with transistors) designed to execute instructions such as a general-purpose processor and/or a special-purpose processor. Processes taught by the discussion above may also be performed by (in the alternative to a machine or in combination with a machine) electronic circuitry designed to perform the processes (or a portion thereof) without the execution of program code.

The disclosure also relates to an apparatus for performing the operations described herein. This apparatus may be specially constructed for the required purpose, or it may comprise a general-purpose device selectively activated or reconfigured by a computer program stored in the device. Such a computer program may be stored in a non-transitory computer readable storage medium, such as, but not limited to, any type of disk including floppy disks, optical disks, CD-ROMs, and magnetic-optical disks, DRAM (volatile), flash memory, read-only memories (ROMs), RAMs, EPROMs, EEPROMs, magnetic or optical cards, or any type of media suitable for storing electronic instructions, and each coupled to a device bus.

A machine readable medium includes any mechanism for storing information in a form readable by a machine (e.g., a computer). For example, a non-transitory machine readable medium includes read only memory ("ROM"); random access memory ("RAM"); magnetic disk storage media; optical storage media; flash memory devices; etc.

An article of manufacture may be used to store program code. An article of manufacture that stores program code may be embodied as, but is not limited to, one or more non-transitory memories (e.g., one or more flash memories, random access memories (static, dynamic or other)), optical disks, CD-ROMs, DVD ROMs, EPROMs, EEPROMs, magnetic or optical cards or other type of machine-readable media suitable for storing electronic instructions. Program code may also be downloaded from a remote computer (e.g., a server) to a requesting computer (e.g., a client) by way of data signals embodied in a propagation medium (e.g., via a communication link (e.g., a network connection)) and then stored in non-transitory memory (e.g., DRAM or flash memory or both) in the client computer.

The preceding detailed descriptions are presented in terms of algorithms and symbolic representations of operations on data bits within a device memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving," "determining," "sending," "terminating," "waiting," "changing," or the like, refer to the action and processes of a device, or similar electronic computing device, that manipulates and transforms data represented as physical (electronic) quantities within the device's registers and memories into other data similarly represented as physical quantities within the device memories or registers or other such information storage, transmission or display devices.

The processes and displays presented herein are not inherently related to any particular device or other apparatus. Various general-purpose systems may be used with programs in accordance with the teachings herein, or it may prove convenient to construct a more specialized apparatus to perform the operations described. The required structure for a variety of these systems will be evident from the description below. In addition, the disclosure is not described with reference to any particular programming language. It will be appreciated that a variety of programming languages may be used to implement the teachings of the disclosure as described herein.

In the foregoing specification, specific exemplary embodiments have been described. It will be evident that various modifications may be made to those embodiments without departing from the broader spirit and scope set forth in the following claims. The specification and drawings are, accordingly, to be regarded in an illustrative sense rather than a restrictive sense.

What is claimed is:

1. A non-transitory machine readable medium storing executable program instructions which when executed by a data process system cause the data processing system to perform a method, the method comprising:

calibrating a virtual thermal camera using a known virtual object that has a predetermined temperature, the calibrating comprising calculating a set of sensor parameters of the virtual thermal camera based on energy data of a calibration scene containing the virtual object to produce calibrated sensor parameters that cause the virtual thermal camera to provide an output of temperature for one or more pixels in the calibration scene containing the virtual object, the temperature for the one or more pixels derived from the energy data for the one or more pixels in the calibration scene; and generating a set of simulated virtual thermal images of a virtual scene surrounding the calibrated virtual thermal camera on a simulated vehicle that is driving through the virtual scene, the generating using the calibrated virtual thermal camera to compute a set of temperature maps of images from energy data of the virtual scene, wherein the energy data of the virtual scene is converted into pixel temperature data, wherein random noise data is added to the pixel temperature data, the set of temperature maps based on the pixel temperature data, and the set of simulated virtual thermal images being derived from the set of temperature maps.

2. The medium as in claim 1 wherein the calculating of the set of sensor parameters comprises repeatedly calculating the set of sensor parameters in an optimization loop until a converged optimum solution for the set of sensor parameters is achieved.

3. The medium as in claim 1, wherein the method further comprises:

converting, as part of the calibrating, the energy data for the one or more pixels in the calibration scene into first pixel temperature data to derive first temperature data for each of the one or more pixels in the calibration scene.

4. The medium as in claim 3, wherein the method further comprises:

converting, as part of the generating of the set of simulated virtual thermal images, the energy data for the one or more pixels in the virtual scene into second pixel temperature data and adding the random noise data, represented by one or more temperatures, to the second pixel temperature data to derive second combined temperature data for each of the one or more pixels in the virtual scene.

5. The medium as in claim 4, wherein the calibrated sensor parameters are used to convert the energy data for the one or more pixels in the calibration scene into the first pixel temperature data.

6. The medium as in claim 5, wherein the method further comprises:

converting the second combined temperature data into energy data with added noise for the one or more pixels in the virtual scene.

7. The medium as in claim 6, wherein the method further comprises:

propagating virtual images through a lens model of the calibrated virtual thermal camera to generate the set of simulated virtual thermal images.

8. The medium as in claim 6, wherein the set of sensor parameters are camera specific parameters that are used in one or more equations to convert between energy data and temperature.

9. The medium as in claim 8, wherein the method further comprises:

storing the set of simulated virtual thermal images for use in testing one or more autonomous driving algorithms.

10. The medium as in claim 9, wherein the virtual thermal camera is a long wave infrared virtual thermal camera, and wherein the energy data is a radiative energy flux through a surface area.

11. A machine implemented method comprising:

calibrating a virtual thermal camera using a known virtual object that has a predetermined temperature, the calibrating comprising calculating a set of sensor parameters of the virtual thermal camera based on energy data of a calibration scene containing the virtual object to produce calibrated sensor parameters that cause the virtual thermal camera to provide an output of temperature for one or more pixels in the calibration scene containing the virtual object, the temperature for the one or more pixels derived from the energy data for the one or more pixels in the calibration scene; and generating a set of simulated virtual thermal images of a virtual scene surrounding the calibrated virtual thermal camera on a simulated vehicle that is driving through the virtual scene, the generating using the calibrated virtual thermal camera to compute a set of temperature maps of images from energy data of the virtual scene, wherein the energy data of the virtual scene is converted into pixel temperature data, wherein random noise data is added to the pixel temperature data, the set of temperature maps based on the pixel temperature data, and the set of simulated virtual thermal images being derived from the set of temperature maps.

12. The method as in claim 11 wherein the calculating of the set of sensor parameters comprises repeatedly calculating the set of sensor parameters in an optimization loop until a converged optimum solution for the set of sensor parameters is achieved.

13. The method as in claim 11, wherein the method further comprises:

converting, as part of the calibrating, the energy data for the one or more pixels in the calibration scene into first pixel temperature data to derive first temperature data for each of the one or more pixels in the calibration scene.

14. The method as in claim 13, wherein the method further comprises:

converting, as part of the generating of the set of simulated virtual thermal images, the energy data for the one or more pixels in the virtual scene into second pixel temperature data and adding the random noise data, represented by one or more temperatures, to the second pixel temperature data to derive second combined temperature data for each of the one or more pixels in the virtual scene.

15. The method as in claim 14, wherein the calibrated sensor parameters are used to convert the energy data for the one or more pixels in the calibration scene into the first pixel temperature data.

16. The method as in claim 15, wherein the method further comprises:

converting the second combined temperature data into energy data with added noise for the one or more pixels in the virtual scene.

17. The method as in claim 16, wherein the method further comprises:

propagating virtual images through a lens model of the calibrated virtual thermal camera to generate the set of simulated virtual thermal images.

18. The method as in claim 16, wherein the set of sensor parameters are camera specific parameters that are used in one or more equations to convert between energy data and temperature.

19. The method as in claim 18, wherein the method further comprises:

storing the set of simulated virtual thermal images for use in testing one or more autonomous driving algorithms.

20. The method as in claim 19, wherein the virtual thermal camera is a long wave infrared virtual thermal camera, and wherein the energy data is a radiative energy flux through a surface area.

* * * * *